United States Patent
Milijevic (10) Patent No.: US 9,444,470 B2
(45) Date of Patent: Sep. 13, 2016

(54) DOUBLE PHASE-LOCKED LOOP WITH FREQUENCY STABILIZATION

(71) Applicant: MICROSEMI SEMICONDUCTOR ULC, Kanata (CA)

(72) Inventor: Slobodan Milijevic, Ottawa (CA)

(73) Assignee: Microsemi Semiconductor ULC, Kanata, ON (CA)

( * ) Notice: Subject to any disclaimer, the term of this patent is extended or adjusted under 35 U.S.C. 154(b) by 0 days.

(21) Appl. No.: 14/595,309

(22) Filed: Jan. 13, 2015

(65) Prior Publication Data

US 2015/0222276 A1 Aug. 6, 2015

Related U.S. Application Data

(60) Provisional application No. 61/934,044, filed on Jan. 31, 2014.

(51) Int. Cl.
| H03L 7/06 | (2006.01) |
|---|---|
| H03L 7/087 | (2006.01) |
| H03L 7/099 | (2006.01) |
| H03L 7/07 | (2006.01) |
| H03L 7/08 | (2006.01) |
| H03L 7/22 | (2006.01) |

(52) U.S. Cl.
CPC ............... *H03L 7/087* (2013.01); *H03L 7/07* (2013.01); *H03L 7/0805* (2013.01); *H03L 7/0991* (2013.01); *H03L 7/22* (2013.01); *H03L 7/0807* (2013.01)

(58) Field of Classification Search
None
See application file for complete search history.

(56) References Cited

U.S. PATENT DOCUMENTS

| 4,856,027 | A | * | 8/1989 | Nakamura | H04L 27/2273 |
|---|---|---|---|---|---|
| | | | | | 329/308 |
| 5,038,115 | A | * | 8/1991 | Myers | H03L 7/0805 |
| | | | | | 327/552 |
| 5,163,160 | A | * | 11/1992 | Foucher | H03L 7/10 |
| | | | | | 455/13.2 |
| 5,329,250 | A | * | 7/1994 | Imaizumi | H03L 7/235 |
| | | | | | 331/11 |
| 7,148,753 | B1 | * | 12/2006 | Garlepp | H03L 7/07 |
| | | | | | 327/156 |
| 2005/0175137 | A1 | * | 8/2005 | Khlat | H03C 3/0925 |
| | | | | | 375/376 |
| 2006/0170505 | A1 | * | 8/2006 | Humphreys | H03C 3/0966 |
| | | | | | 331/16 |
| 2011/0243291 | A1 | * | 10/2011 | McAllister | H04J 3/0658 |
| | | | | | 375/376 |

FOREIGN PATENT DOCUMENTS

CN 202818271 U 3/2013

\* cited by examiner

*Primary Examiner* — Cassandra Cox
(74) *Attorney, Agent, or Firm* — Marks & Clerk; Richard J. Mitchell (57) ABSTRACT

A double phase-locked has a first phase-locked loop including a first narrowband loop filter configured to reduce phase noise in a first input clock, and a second phase-locked loop including a second loop filter configured to receive a second input clock from a stable clock source. The second clock has a frequency close to said first clock. The first loop has a bandwidth at least an order of magnitude less than the second loop. A coupler couples the first and second phase-locked loops to provide a common output. The double phase-locked loop can be used, for example, to provide time-of-day information in wireless networks or as a fine filter for cleaning phase noise from clock signals recovered over telecom/datacom networks.

25 Claims, 12 Drawing Sheets

DOUBLE PHASE-LOCKED LOOP WITH FREQUENCY STABILIZATION

CROSS REFERENCE TO RELATED APPLICATION

This application claims the benefit under 35 USC 119 (e) of U.S. provisional application No. 61/934,044 filed Jan. 31, 2014, the contents of which are herein incorporated by reference.

FIELD OF THE INVENTION

This invention relates to the field of clock synchronization in telecom/datacom networks, and in particular a double phase-locked loop (PLL) with frequency stabilization.

BACKGROUND OF THE INVENTION

Wireless base stations in cellular networks need to be mutually synchronized for seamless transition (handover) of calls when a wireless phone user moves between wireless cell boundaries and also to support some additional services (for example, location services).

In general, cells in a wireless network can be synchronized in any, and all of, frequency, phase and time-of-day. Frequency synchronization assumes that local clocks in each cell have the same frequency. This can be achieved if all cells are frequency synchronized to some master clock via T1/E1/Synchronous Ethernet links. Traditional Ethernet is an asynchronous packet network protocol, which does not assume that the nodes are synchronized to a common source. In synchronous Ethernet clock signals are transferred over the Ethernet physical layer so that all nodes are synchronized to a common source.

Phase synchronization requires that clock transitions at each cell occur at the same time. If cells are synchronized in phase they have to be synchronized in frequency as well, otherwise the clock phases of corresponding cells will drift relative to each other. Clocks can be synchronized in phase and frequency to each other without being synchronized to standard time (Universal Coordinated Time).

Time-of-day synchronization assumes that each node knows the exact time of the day relative to universal coordinated time at any instant and the time-of-day difference between any two nodes is very small, in practice less than 1.5 µs.

Synchronization in synchronous Ethernet is achieved in much the same way as in SONET/SDH networks where all nodes are synchronized only in frequency (not time-of-day) to a Primary Reference Clock (PRC). The PRC is a free running atomic clock or clock traceable to an atomic clock with a frequency accuracy better than $10^{-11}$. There is however no provision for time-of-day synchronization in synchronous Ethernet. Although the PRC driving synchronous Ethernet network is very accurate, the synchronous Ethernet standard, as defined by ITU-T Rec. G8261, 8262 and 8264, does not require the PRC to be synchronized to Coordinated Universal Time (UTC). The frequency generated by the synchronous Ethernet PRC can be up to $10^{-11}$ off the frequency of the UTC master clock, which translates to error that accumulates at the rate of 36 ns/hour. Consequently, the PRC cannot be used to generate time-of-day information.

Time-of-day synchronization can be achieved by synchronizing local clocks via GPS signals or using the IEEE 1588 protocol. Synchronization in accordance with IEEE 1588 is achieved by transmitting time-stamped timing packets over the Ethernet network from a master clock synchronized to UTC. Due to the stochastic nature of packet queuing in network nodes, propagation delay varies from packet to packet. In general, packet propagation delay increases as the traffic load in the network increases, which adversely affects quality of the time-of-day synchronization under IEEE 1588.

One way to mitigate the effect of packet delay variation is to employ a hybrid system using synchronized Ethernet for synchronizing frequency and IEEE1588 for phase/time of the day synchronization. A drawback to this solution as currently implemented is that it is not possible to synchronize to the IEEE1588 source and the PRC at the same time, which means that while the time-of-day is being synchronized the frequency is tied to the local oscillator in the IEEE 1588 slave node. This oscillator has stability several orders of magnitude worse than the PRC.

Another major application of PLLs in telecom/datacom systems is to clean phase noise (jitter/wander) present at recovered clock at the output of PHY devices. Phase noise is divided into wander (phase noise frequencies less than 10 Hz) and jitter (phase noise frequencies above 10 Hz). A PLL behaves as a low pass filter for any phase noise present at its input reference. This property implies that phase noise can be reduced at the output of a PLL by reducing the loop bandwidth. However, while a PLL behaves as a low pass filter for any noise present at the input reference it also behaves as a high pass filter for any noise present at the local oscillator. In case of a digital PLL this is the noise coming from crystal oscillator (XO) or master clock that is used to drive the DCO. Although XOs are quite stable, their frequency is a function of temperature and some other factors (such as aging, voltage and vibration). Temperature is the most dominant factor. If an XO is used as the master clock for a digital PLL (DPLL), the loop bandwidth cannot be too low. With a narrow loop bandwidth the DPLL output will wander as the ambient temperature changes. As an example if the loop bandwidth is set at 0.1 Hz, than any jitter/wander with frequency above 0.1 Hz will appear at the DPLL output without any attenuation.

The problem of jitter/wander can partly be overcome by using Temperature Controlled Crystal Oscillators (TCXO) and Oven Controlled Crystal Oscillators (OCXOs) as the DPLL master clock. TCXOs have an electronic circuit that measures ambient temperature and, based on this measurement, adjusts the frequency of the XO to be as close as possible to nominal. OCXOs on the other hand have an oven that heats a crystal to a fixed temperature, which is higher than the ambient temperature specified for the OCXO. For example if the OCXO is specified to be used in the −40 C to 70 C range its oven temperature will typically be 85 C. An OCXO achieves stability by maintaining the temperature of the crystal at 85 C at all times regardless of the ambient temperature.

While they can achieve much better stability than simple XOs, TCXOs and OCXOs are much more expensive. Currently XOs are typically cost less than $1, TCXOs are in $15 to $50 range and OCXOs are generally over $50. However, these are not the only deficiencies of TCXOs and OCXOs. While TCXOs have higher long-term stability than XOs, they have larger high frequency jitter because an electronic circuit that constantly adjusts frequency of the crystal also injects noise. OCXOs on the other hand have comparable or better phase noise than regular XOs but they come in much bigger package, they burn much more power (to heat the oven) and have lower reliability (they run at high temperature all the time).

Another important reason for use of TCXOs and OCXOs as master clock is their long-term stability. When the DPLL loses all input references, the DPLL will go into holdover mode where the stability of its output frequency fully depends on the stability of the master clock oscillator (TCXO and OCXO).

SUMMARY OF THE INVENTION

Embodiments of the invention allow phase-locked loops with very narrow loop bandwidths to be used without loss of stability. The narrow loop bandwidth enables the phase noise in the input signal to be significantly reduced. One application is in the field of time-of-day synchronization in wireless networks. The local clock may be locked both to a PRC, which provides frequency stability, and to a standard clock, such as UTC, to ensure that the local clock generator is synchronized in the time of day to the standard clock. The PRC clock helps to eliminate the wander that is present in the timing information obtained from the UTC clock. Another application is in traditional (frequency synchronization only) datacom/telecom systems, such as T1/E1, SONET/SDH, Synchronous Ethernet, which utilize DPLLs to clean phase noise present at a recovered clock of the physical layer device.

According to a broad aspect of the invention there is provided a double phase-locked loop, comprising a first narrowband phase-locked loop including a first loop filter configured to reduce phase noise in a first input clock; a second phase-locked loop including a second loop filter configured to receive a second input clock from a stable clock source, said second clock having a frequency close to said first clock; said first loop filter having a bandwidth at least an order of magnitude less than second loop filter; and a coupler configured to couple said first and second phase-locked loops to provide a common output whereby said second phase-locked loop stabilizes said first phase-locked loop.

The invention assumes that the frequencies of the first and second clock are sufficiently close such that any offset between the frequencies of the first and second clocks is fractional in nature. The term close is herein defined as meaning that any fractional offset between the two frequencies is not more than 200 ppm. It will of course be appreciated that it is possible to employ different frequencies so long as one is divided down such that the resulting frequencies do not exceed the fractional offset of 200 ppm. The bandwidth of the narrowband loop may be in the range 1 mHz to 0.1 Hz to remove the phase noise in the first input clock. The bandwidth of the second phase-locked loop may be in the range 0.1 to 10 Hz depending on the application, provided that the ratio between the bandwidths of the two loop filters is at least 10:1.

The double phase-locked loop will have its own crystal oscillator (XO) driving the digital controlled oscillator (DCO), but this can be a regular low-cost XO, which is not required to have a very high degree of stability.

The double phase-locked loop may comprise one loop embedded within the other sharing a common controlled oscillator or two separate loops with respective controlled oscillators coupled together.

In the case of a wireless base station application, the stable clock source is the clock recovered from the PRC using the clock data recovery module in the Ethernet physical device (PHY). The first input clock is the clock recovered from the remote standard clock using, for example, the IEEE1588 clock recovery algorithm.

As indicated above, the term close in this context means that the frequencies are nominally the same but with potentially some fractional difference between them. In the case of an IEEE1588 application, the fractional difference will be in the order of $10^{-11}$, amounting to 36 ns/hour, because that is a worst-case scenario for the accuracy of an atomic clock. For other applications, where the stable frequency originates from TCXO/OCXO the fractional frequency difference can be much larger, for example, in the order of 10 parts per million.

The frequencies of the primary reference clock (PRC) and master clock (UTC) will nominally be the same, but with a small offset in the order of $10^{-11}$, amounting to about 36 ns/hour phase difference. The clock recovery algorithm used to recover the standard clock is subject to severe wander due to packet delay variation. In accordance with embodiments of the invention, this wander is removed by using a very low pass filter and using the PRC clock to overcome the resulting stability issues.

In the case of the datacom/telecom application, the second input is derived from a TXCO/OXCO that may be supplying multiple DPLLs. In this case, especially if the TXCO/OXCO is feeding multiple DPLLs, there may be some jitter/wander (generally referred to as phase noise) resulting from the crosstalk and noise coupling onto transmission lines used to carry the signals to the individual DPLLs, but this can be filtered out by the loop filter in the DPLL.

According to another aspect of the invention there is provided a method of generating a local clock in a synchronous packet communications network, wherein the local clock is locked to a stable reference clock and to a master clock in a phase-locked loop including a first low pass filter, comprising extracting a clock signal derived from said reference clock from an incoming data stream over the synchronous packet communications network; determining a first phase error of a controlled oscillator relative to said clock signal; generating a second phase error that is subject to wander of the controlled oscillator relative to said master clock; filtering said second phase error with a second low pass filter having a cut-off frequency less than said first low pass filter; adding said filter second phase error to said first phase error; and adjusting the frequency of the controlled oscillator in the phase-locked loop based on the sum of said first and second phase errors.

Typically, the standard clock will be universal coordinated time (UTC), but in theory it could be some other common standard. The sequence the steps set forth is not important. For example, typically the steps of generating the first and second phase errors will be performed simultaneously.

For the avoidance of doubt in this context the term adding includes subtracting in that the addition of a negative value amounts to subtraction. In this specification a digital phase-locked loop is referred to as a DPLL. Embodiments of the invention relate to a double phase-locked loop, which in the preferred embodiment is digital, namely a double DPLL (DDPLL).

A DDPLL in accordance with embodiments of the invention is capable of locking on to multiple, independent clock sources (whether traceable to single source or not) simultaneously, and capable of generating one or multiple output clocks which have phase/time and frequency accuracy based on the most accurate input phase/time source and the frequency stability as the most stable frequency input source.

BRIEF DESCRIPTION OF THE DRAWINGS

The invention will now be described in more detail, by way of example only, with reference to the accompanying drawing, in which.

DETAILED DESCRIPTION OF THE INVENTION

Figure 1:
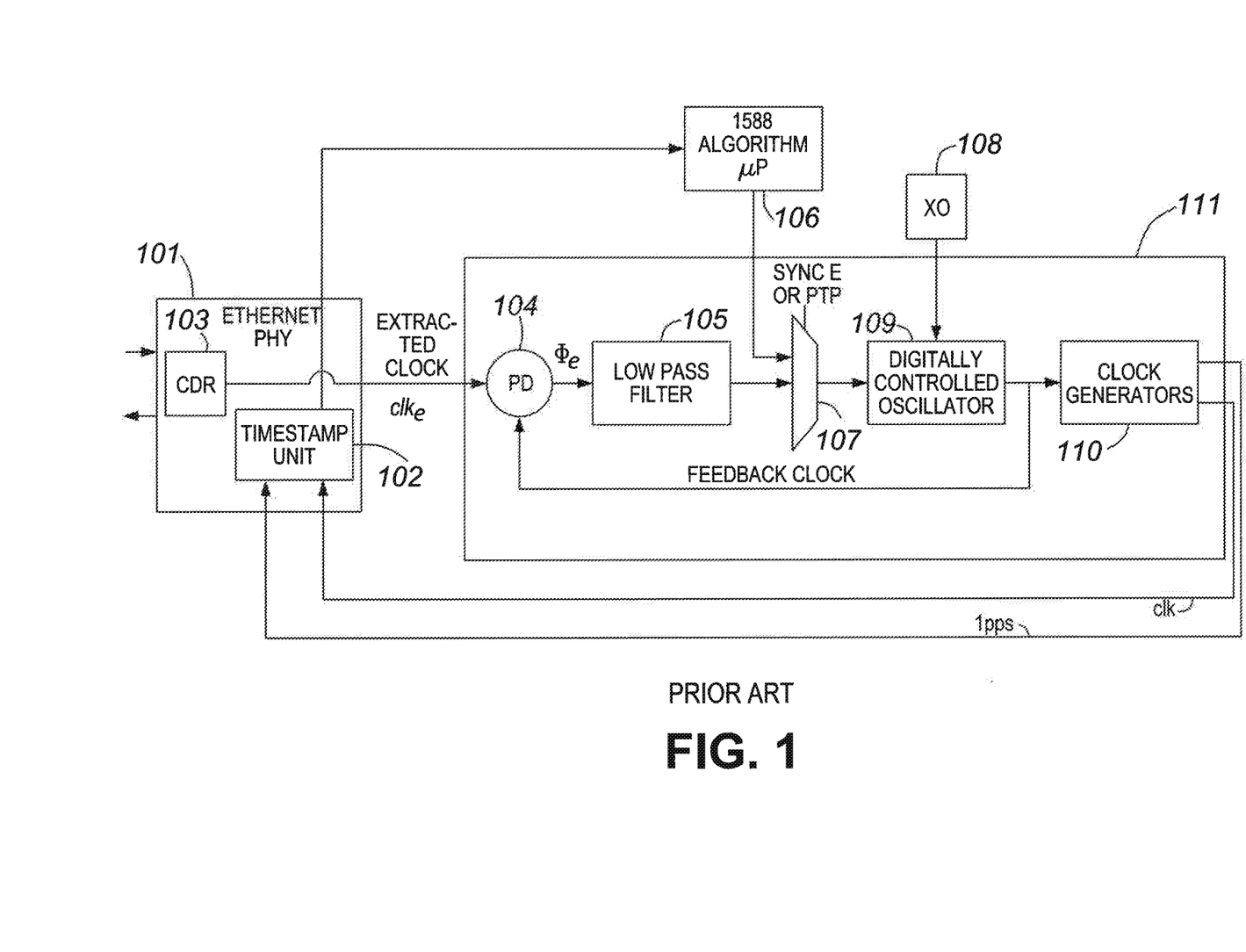
FIG. 1 is top-level block diagram of a prior art Hybrid (IEEE1588 plus SyncE) local clock generator.

The invention will first be exemplified in the context of a local clock generator providing time-of-day information The prior-art hybrid clock generator circuit shown FIG. 1 comprises an Ethernet Physical Layer Device (PHY) 101, which a receives a synchronous Ethernet signal and separates data and clock information from this signal in the clock data recovery (CDR) module 103. The extracted clock signal $clk_e$ is fed to a block 111 forming part of a digital phase-locked loop. This block 111 locks to this extracted clock $clk_e$ and removes jitter and wander. A clock generator 110 generates an output clock signal clk as well as a one part per second signal (1 pps) based on the output of a digital controlled oscillator (DCO) 109.

Both the clk and 1 pps signals are fed back to a timestamp module 102 in the PHY device 101. The time stamped packets, which are derived from the received packets by time stamp unit 102, are used by microprocessor (uP) 106 running the IEEE 1588 algorithm to generate a phase error relative to a remote master clock set to coordinated universal time (UTC) and supplying IEEE1588 timing packets into the network.

The DPLL 111 comprises a phase detector 104, which outputs an error signal $\phi_e$ representing the difference in phase between a signal fed back from the output of the DCO 109 and the extracted clock $clk_e$ output by the CDR 103. This error signal $\phi_e$ is fed through a low pass loop filter 105 and a multiplexer 107 to the input of the DCO 109, which is driven by a crystal oscillator 108. The filtered error signal output from the low pass loop filter 105 corrects the frequency of the DCO 109 so that it tracks the clock signal $clk_e$ extracted from the incoming synchronous Ethernet.

The time stamp module 102 in the PHY module 101 recognizes IEEE 1588 timing packets and time stamps them on arrival. The time stamp module 102 applies a time stamp as soon as it detects leading bits of an IEEE 1588 packet.

The time stamps applied by the time stamp module 102 are compared in a microprocessor (uP) 106 running the IEEE 1588 protocol with the time stamps carried in the IEEE 1588 packets to generate a phase error signal that relates the local clock time clk output by the clock generator 110 to coordinated universal time (UTC). This phase error signal is fed via the multiplexer 107 to the DCO 109 in response to a control signal output by the uP 106, and is operative to speed up or slow down the local clock so that it is synchronized in phase/frequency and time-of-day to the IEEE 1588 master clock. Due to stochastic nature of the packet delay in the packet network, frequency synchronization based solely on IEE 1588 timing packets has a high degree of wander, which adversely affects synchronization.

By adopting a hybrid approach wherein frequency synchronization is obtained from synchronous Ethernet and time-of-day synchronization is obtained from 1588 timing packets, a more accurate time-of-day synchronization can be achieved. However, in the prior art shown in FIG. 1 the frequency of the DPLL 111 as determined by the synchronous Ethernet is adjusted under command of the uP 106 to compensate for the fact that the synchronous Ethernet frequency can be $10^{-11}$ off the UTC master clock frequency by periodically breaking, with the aid of the multiplexer 107, the loop of DPLL 111 used for frequency synchronization. While this loop of the DPLL 111 is broken, the frequency and phase of the DCO 109 are adjusted by a signal from the uP 106 so that the average frequency of the DPLL 111 clock output is equal to UTC frequency and that the one-part-per-second (1 pps) DPLL 111 output is aligned with the UTC 1 pps signal.

The disadvantage of this solution is that during the time that the DCO 109 is controlled by the IEEE 1588 algorithm and the loop of the DPLL 111 is broken, the DPLL 111 is not synchronized to the PRC. During this time the frequency generated by the DCO 109 is dependent on the stability of local crystal oscillator (XO) 108, which is several orders of magnitude worse than the stability of PRC clock. This arrangement thus requires use of very expensive crystal oscillators. The problem is further aggravated in boundary clock IEEE 1588 hybrid mode applications where the time-of-day is recovered multiple times along a transmission chain as the boundaries between different time domains are crossed.

Figure 2:
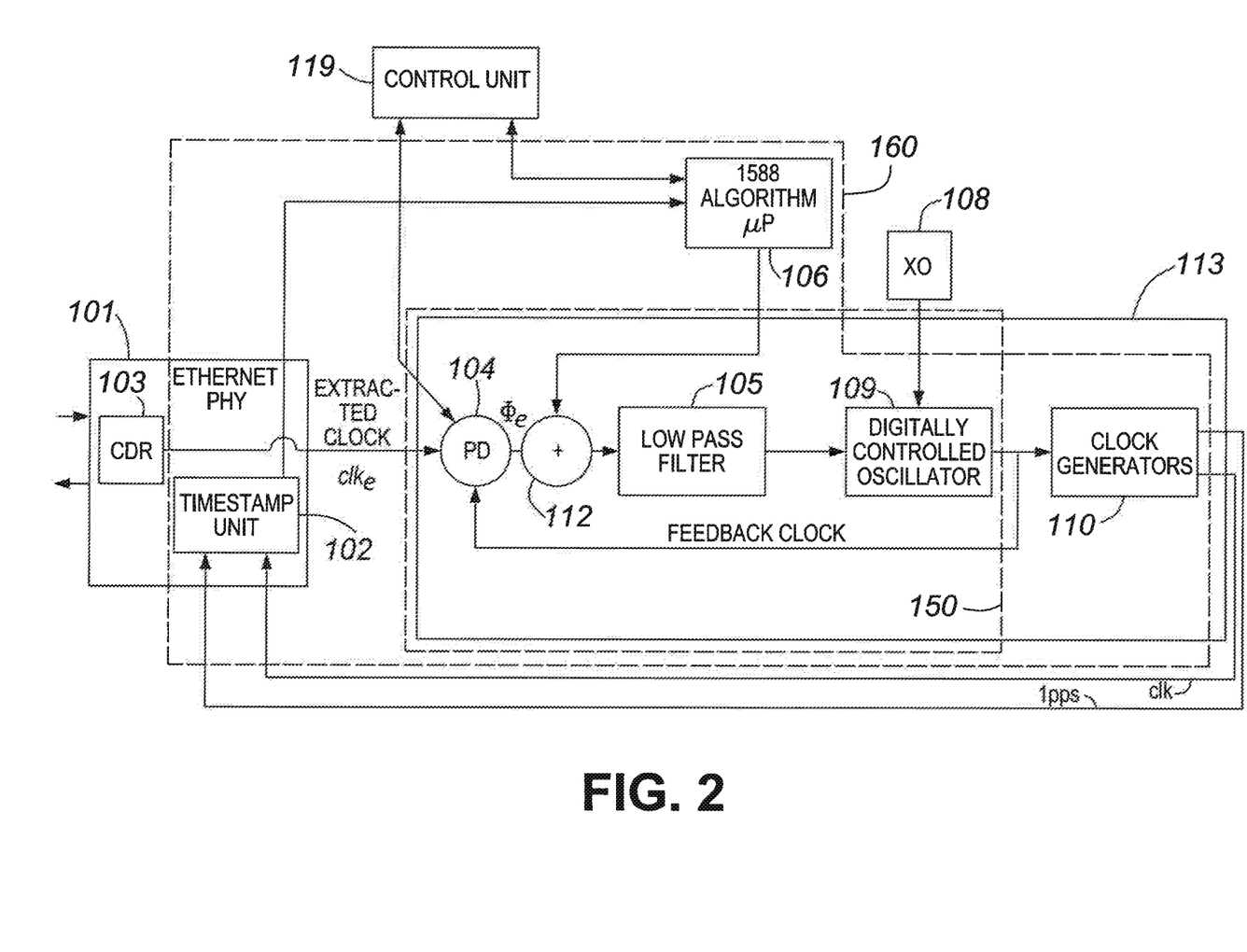
FIG. 2 is a top-level block diagram of the hybrid (IEEE1588 plus SyncE) synchronization according to an embodiment of the invention.

FIG. 2 shows a local clock generator in accordance with an embodiment of the invention employing a double DPLL wherein, unlike the case in FIG. 1, the time-of-day synchronization is achieved by locking a double DPLL 113 to the remote UTC clock in both phase and frequency without breaking the loop of the double DPLL 113. The UTC clock provides the time-of-day information. Parts that are the same as those in FIG. 1 have the same reference numerals.

In the embodiment shown in FIG. 2 the double DPLL 113 is locked to the synchronized Ethernet extracted clock $clk_e$ (traceable to the PRC). Any inaccuracies due to frequency stability of the crystal oscillator 108 are corrected in the double DPLL 113 by continuously adjusting the phase of the double DPLL 113 outputs.

In this embodiment a coupler in the form of an adder 112 is placed downstream of the phase detector 104. This is used to add/subtract phase derived from the uP 106 so that the frequency and time of the day output by the clock generator 110 of the double DPLL 113 are equal to the UTC master clock as will be described in more detail. The uP 106 forms part of a second feedback loop controlling the DCO 109, which includes the timestamp unit 102.

Figure 3:
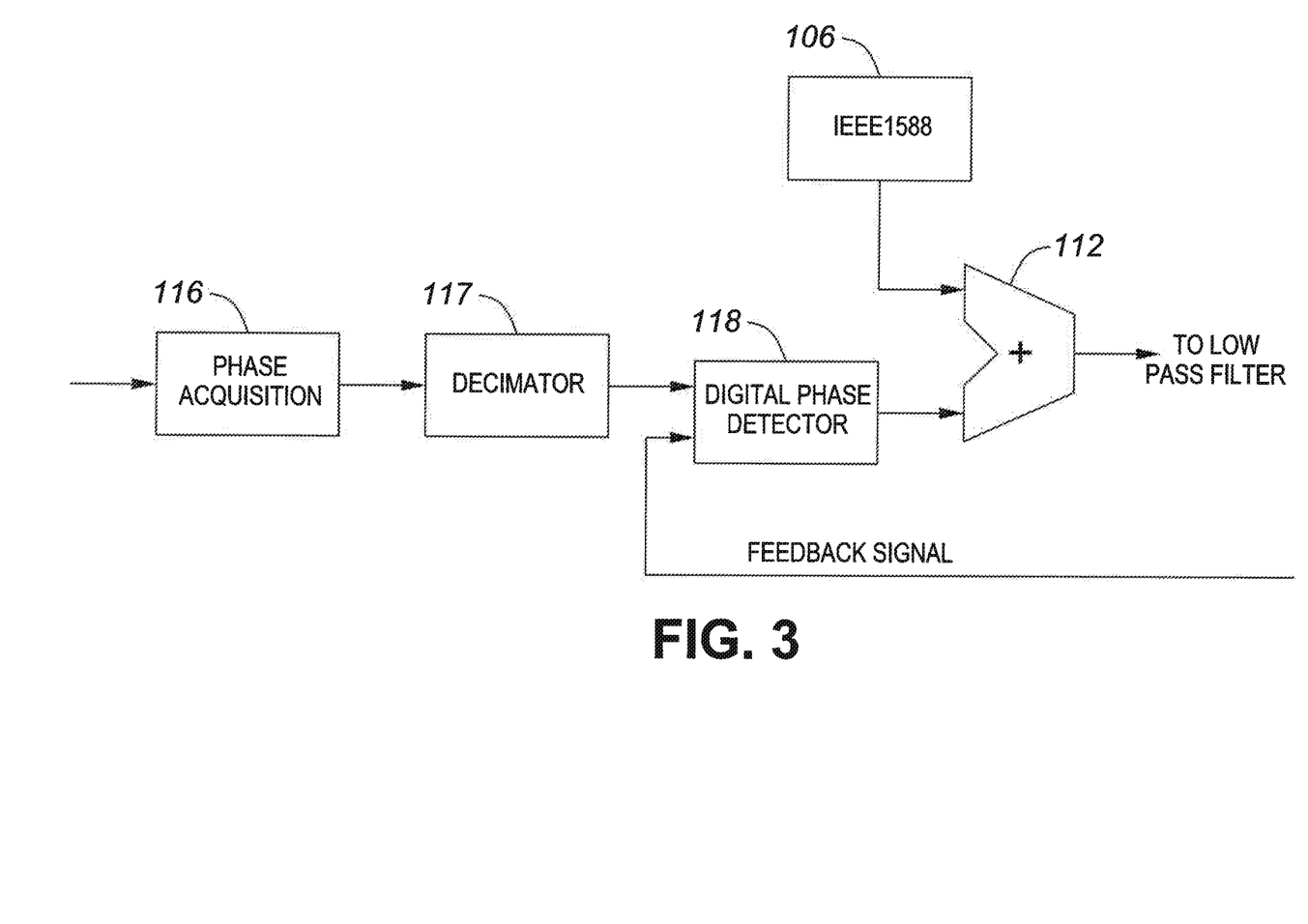
FIG. 3 is a more detailed block diagram of the phase detector.

It will be understood that the local clock generator is digital and can be implemented in either hardware or software. In the latter case the blocks represent software modules that are implemented in a suitable processor, such as a digital signal processor (DSP). The output of each block is updated on each interrupt generated by the crystal oscillator 108. Typically an interrupt occurs several thousand times per second. Details of the phase detector are shown in FIG. 3. As will been seen the phase detector 104 consists of a phase acquisition module 116, a decimator 117, and a digital phase detector element 118.

If we ignore the effect of the adder 112 for the moment, the DCO 109 will lock in frequency and phase to the clock $clk_e$ extracted by the CDR 103. When the double DPLL 113 is in lock, the output of the phase detector 104 will have an average value of zero, although it will vary slightly due to jitter in the extracted clock signal and drift in the XO 108.

The error signal output by the uP 106 represents the phase difference between the current output of the DCO 109 and the UTC master clock. This phase difference, which is generated in accordance with the IEEE 1588 clock recovery algorithm in a similar manner to the arrangement shown in FIG. 1, is added to the output of PD 104 in adder 112 on each interrupt generated by a timer driven from the crystal oscillator 108. The same interrupt also updates all the blocks in the DPLL 113.

Figure 4:
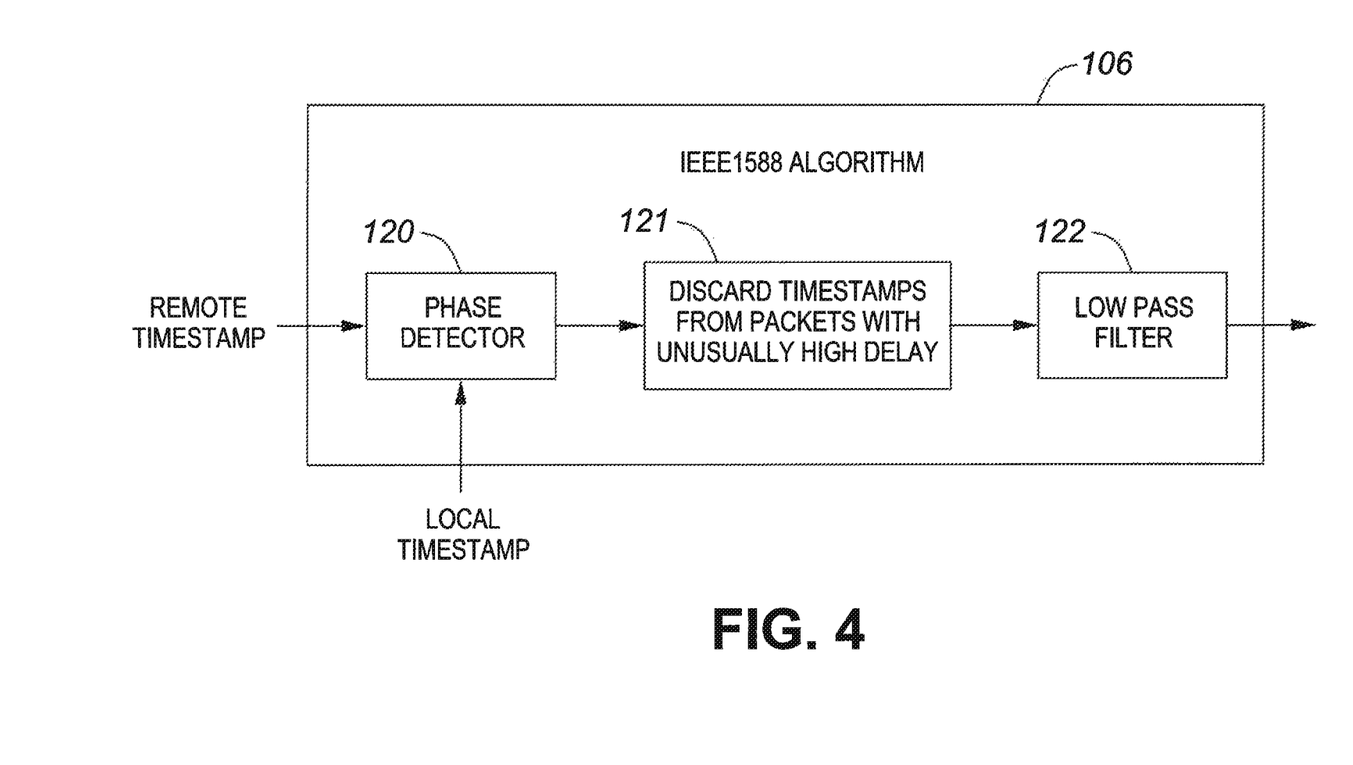
FIG. 4 is a block diagram showing an implementation of the microprocessor running the IEEE 1588 of FIG. 3.

As shown in FIG. 4 the uP 106 comprises a phase detector 120, which compares the remote time stamp carried in the timing packets with a local time stamp of clock clk generated by clock generator 110 to generate a phase error, module 121, which discards packets with excessive delay, and low pass filter 122, which filters the resulting phase error to remove wander.

The IEEE clock recovery algorithm is normally subject to severe wander due the significant variation in packet delay through the network depending on network congestion and other factors. Wander can be reduced by reducing the pass frequency of the loop by modifying parameters of low pass filter 122, but a loop with a very low bandwidth makes it very hard to achieve frequency lock without an extremely stable, and therefore expensive, local oscillator XO 108. In accordance with embodiments of the invention, wander is reduced by setting the cut-off frequency of the first phase-locked loop to a very low value, not greater than 0.1 Hz, and typically 1 mHz-0.1 Hz (0.001 Hz-0.1 Hz). The cut-off frequency, which is in effect the bandwidth, of the first phase-locked loop is much less than the cut-off frequency of the second loop (adjusted by low pass filter 105), and in particular less than 1/10 of the cut-off frequency of the second phase-locked loop. This low cut-off frequency substantially eliminates wander and provides a stable input to the adder 112. The DCO 109 locks in both frequency and phase to the remote UTC clock. The problem of achieving and maintaining (stability) lock is overcome by in effect using the clock signal clk extracted from the syncE signal as a stable frequency source in place of the XO 108 for the IEEE clock recovery algorithm.

The second phase-locked loop has a higher cut-off frequency than the first one. The second loop has a cut-off frequency not greater than 1 Hz, and in the range 0.1 Hz to 1.0 Hz. Since the clock signal clk has much greater stability than the recovered IEEE1588 clock, a higher cut-off frequency, and therefore greater loop bandwidth, can be tolerated, but this means also that DDPLL 113 can therefore readily establish and maintain lock onto the more stable signal $clk_e$ extracted from the SyncE signal by CDR module 103. The SyncE clock also ensures that the DDPLL 113 does not lose its lock on the IEEE1588 clock, which would likely occur due to the very low bandwidth of the first loop controlled by the low pass filter 122.

At start-up the DCO 109 will rapidly lock to the extracted clock clk from the PRC due to the relatively high bandwidth of the second loop controlled by the low pass filter 105 and the stability of the recovered SyncE signal $clk_e$. The μP 106 will have little effect at this point due to the narrow bandwidth of the first loop controlled by the low pass filter 122. However, over time the phase error output by uP 106, which is added to the PD 104, will start to build up to represent the phase difference between the output of the DCO 109 and the IEEE1588 clock. This in turn will change the frequency of the DCO 109 so that it becomes locked to the UTC master clock, i.e. the IEEE1588 clock, in both frequency and phase.

Figure 5:
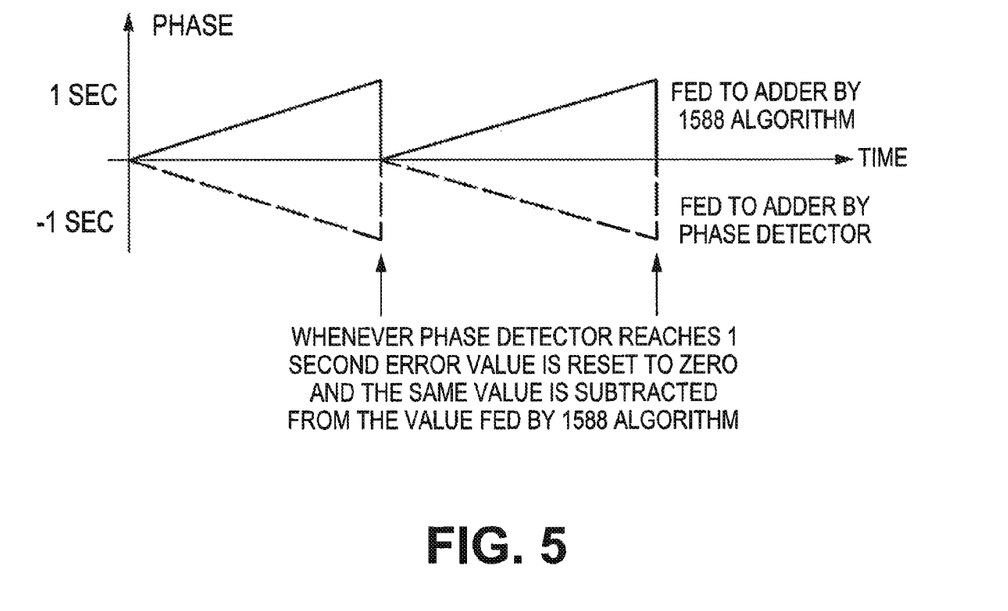
FIG. 5 is a phase diagram showing the drift in phase of the output of the phase detector.

As the DCO 109 becomes locked to the frequency of the UTC master clock, the phase error signal produced by the uP 106 will gradually reduce. If the SyncE clock $clk_e$ is running at exactly the same frequency as the UTC master clock, the outputs of PD 104 and uP 106 would both have a nominal value of zero when the DCO 109 was in lock with the UTC master clock. However, since the SyncE clock $clk_e$ in reality is running at a slightly different frequency from the UTC master clock, the output of PD 104 will gradually increase or decrease over time and be offset by the phase error output by the uP 106 such that the output of the adder 112 will nominally be zero to keep the DCO 109 in lock with the UTC master clock, as shown in FIG. 5. Due to the nature of the feedback loop in the DDPLL 113, when the double phase-locked loop is in lock, i.e. the frequency and phase of the DCO 109 is locked to the IEEE1588 clock source, the output of the adder 112 will be nominally zero since it represents the input to the low pass filter 105, which generates the control signal for the DCO 109.

As noted above, since the frequency derived from the IEEE 1588 clock source and extracted SyncE clock $clk_e$ are slightly off by up to $10^{-11}$, the output of the phase detector will gradually start to increase or decrease over time as shown in FIG. 5. Typically due to the slight frequency difference between PRC and UTC clocks, the absolute phase error accumulates at a maximum rate of 36 ns/hour. Since the output of the phase detector 120 is stored in a buffer (not shown), over time this could potentially overflow. To avoid this problem, the control unit 119 determines on each interrupt whether the phase error $\phi_e$ has exceeded a threshold, for example 1 second. When this occurs the output of the phase detector is reset to zero by control unit 119, and the same amount is added to the value output by uP 106 so that the net effect at the output of the added 112 is zero. In effect to prevent an overflow condition the output of the phase detector 104 and the output of IEEE 1588 uP 106 are adjusted by control unit 119 from time to time as needed by the same absolute amount so as to reset the phase detector to zero without changing value of the output of the adder 112.

Figure 6:
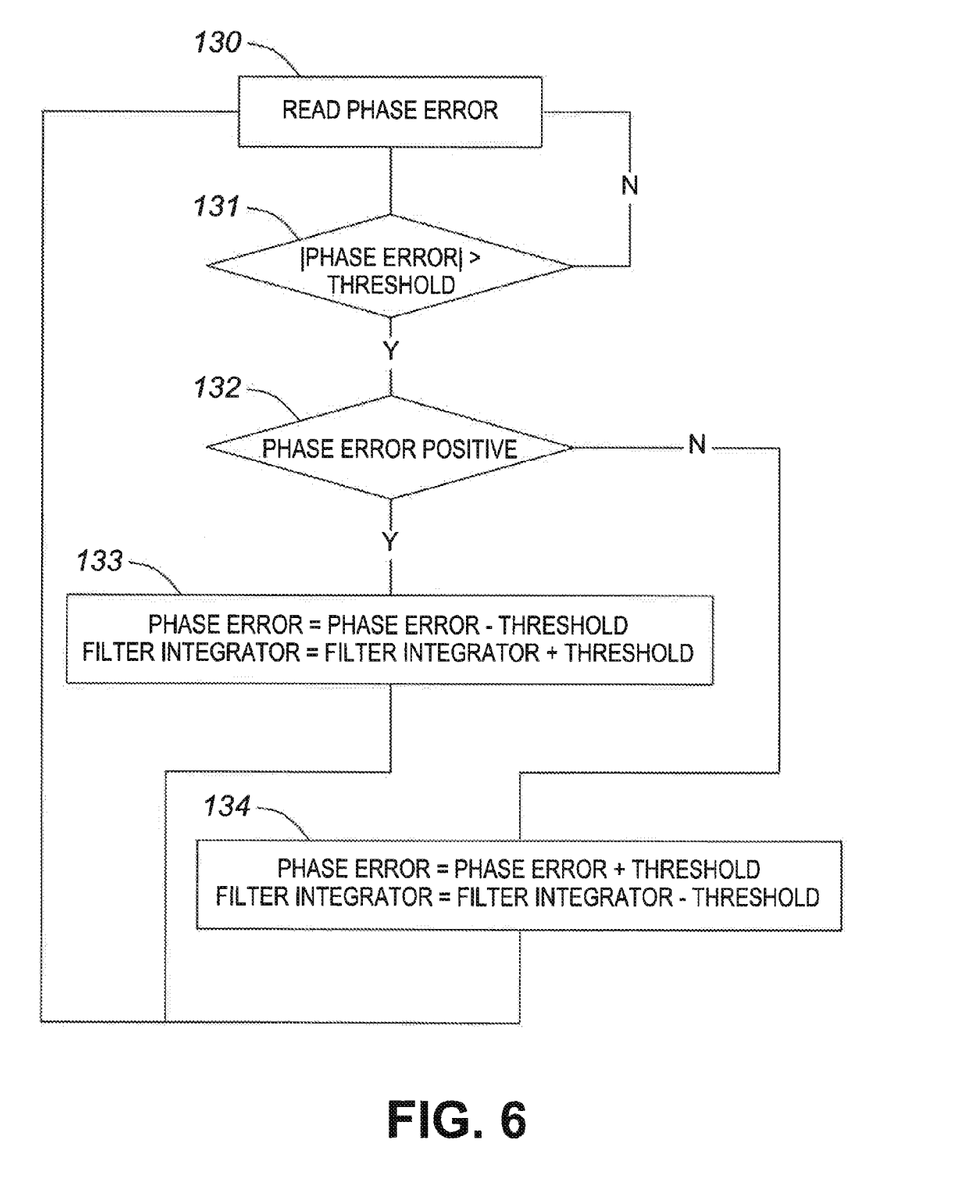
FIG. 6 is an algorithm implemented by the DDPLL to prevent an overflow condition.

The control unit 119 implements the algorithm shown in FIG. 6. In step 130, the phase error at the output of PD 104 is read as Phase Error. Step 131 determines whether the absolute value of this phase error, |Phase Error|, exceeds a predetermined threshold. If the decision in step 131 is yes, decision step 132 determines whether the phase error is positive; if the decision in step 131 is no, step 134 adds the threshold to the current phase error and subtracts it from the value of a filter integrator in the module 106; if the decision in step 131 is yes, step 133 subtracts the threshold from the current phase error and adds it to the output of the low pass filter 122. If the decision in step 131 is no, step 130 is repeated.

The double DPLL 113 may be continuously synchronized to multiple sources (e.g. output of CDR 103 and uP 106) and does not need to switch between them. This arrangement provides very stable output(s). Stringent requirements for the local crystal oscillator 108 are not required. The impact of the error of the crystal oscillator error 108 is minimized because the closed-loop of the frequency stability source is never broken.

The double DPLL 113 shown in FIG. 2 effectively forms a coupled double DPLL wherein the first phase locked loop comprises timestamp unit 102, µP 106 including low pass filter 122, adder 112, low pass filter 105, DCO 109, and clock generators 110, and the second phase-locked loop 150 comprises PD 104, adder 112, low pass filter 105, and DCO 109. One phase-locked loop is embedded within the other, and they are coupled together by a coupler, which in this embodiment is in the form of an adder 112. The second phase-locked loop effectively provides frequency stability to the first, allowing the XO 108 to be a regular low cost oscillator not requiring extremely high stability.

Figure 7:
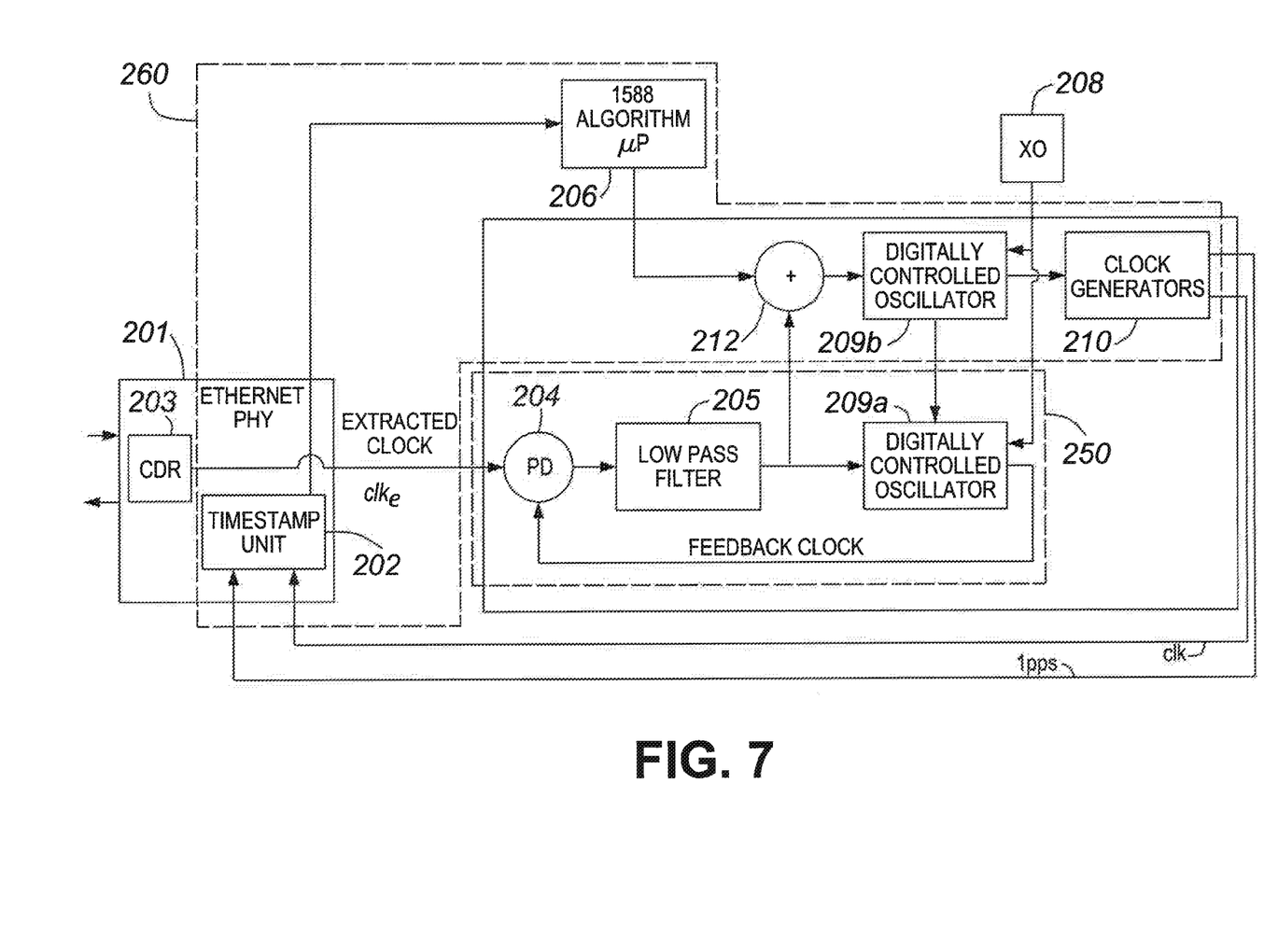
FIG. 7 shows an alternative embodiment to the embodiment shown in FIG. 2.

An alternative embodiment employing two DCOs 209a, 209b is shown in FIG. 7. In this embodiment the phase detector 204 is connected directly to low pass filter 205, the output of which is connected to DCO 209a and an input of a coupler in the form of adder 212. The other input of adder 212 is connected to the output of the µP 206. The output of adder 212 is connected to the input of DCO 209b, the output of which is connected to the input of the clock generators 110. µP 206 is in all respects identical in construction with µP 106 as described above in FIG. 4. The low pass filter 205 bears the same relationship to filter 122 in the µP 206 as described above in the first embodiment. The second embodiment has the advantage that an overflow condition does not occur.

This embodiment works in a similar manner to the FIG. 2 embodiment. The first DDPLL 260 comprises timestamp unit 202, µP 206, adder 212, DCO 209b, and clock generators 210. The second DDPLL 250 comprises PD 204, low pass filter 205 and DCO 209a. In this case the two DDPLLs are coupled together by a coupler in the form of adder 212. The second DPPL, with a higher loop bandwidth, provides frequency stability to first DPLL with narrower loop bandwidth in a similar manner to the embodiment shown in FIG. 2. The XO 208 driving DCOs 209a, 209b can again be a low cost crystal oscillator not required to have extremely high frequency stability.

Figure 8:
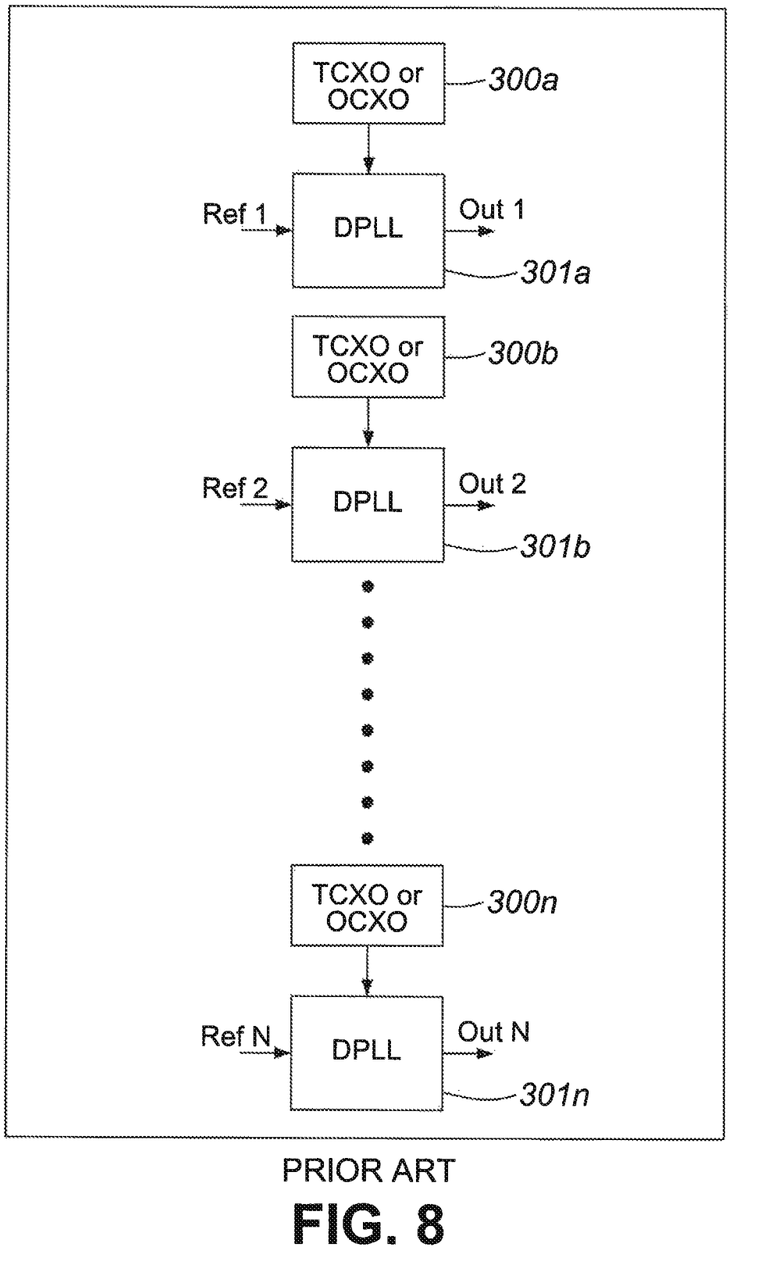
FIG. 8 shows a prior art arrangement of digital phase-locked loops (DPLLs) with individual crystal oscillators according to the prior art.

Another application of the invention can be found in Telecom/Datacom systems that require PLLs with narrow loop bandwidth and/or good holdover. Such systems require a very stable master clock (Temperature Controlled—TCXO or Oven-Controlled—OCXO). TCXOs or OCXOs are generally much more expensive than regular XOs. For applications where there are multiple PLLs with this requirement per box, customers are forced to use a separate TCXO/OCXO 300a . . . 300n for each DPLL 301a . . . 301n as shown in FIG. 8.

Figure 9:
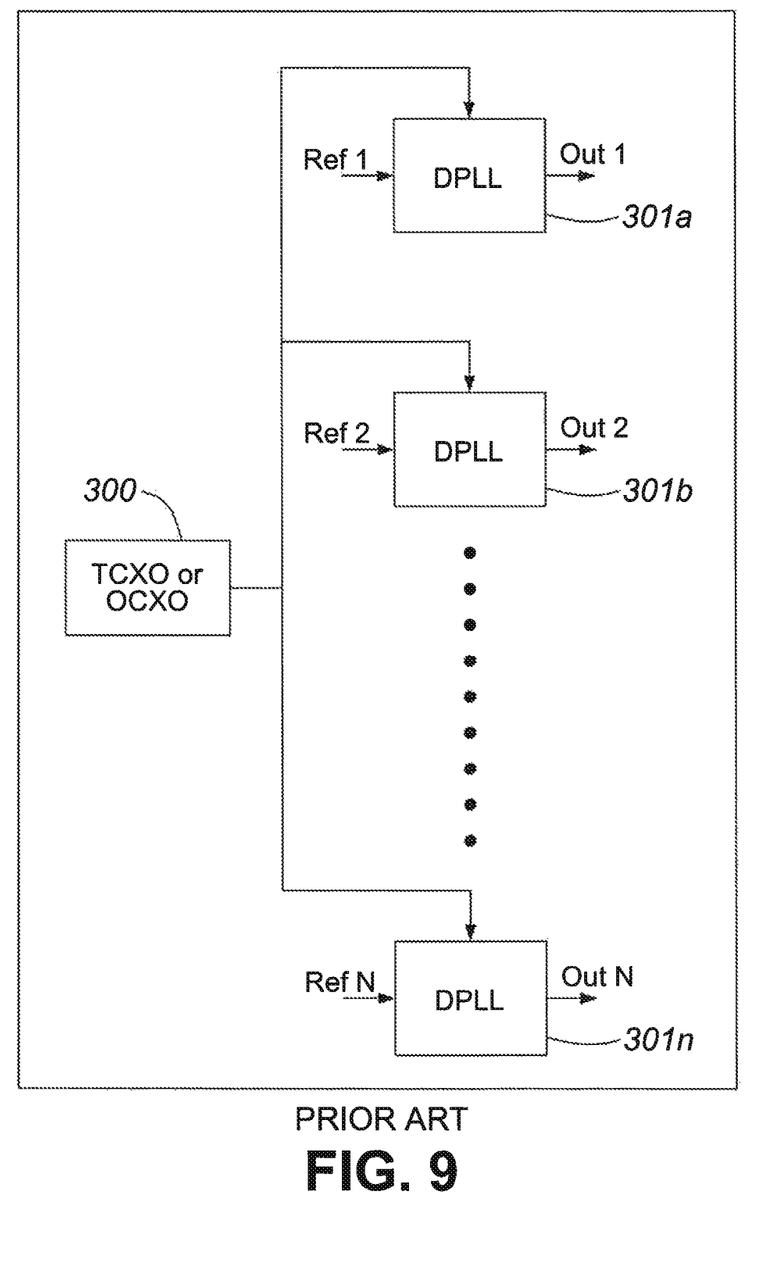
FIG. 9 shows the same arrangement of DPLLs with a common stable crystal oscillator in accordance with the prior art.

It would be desirable to distribute a master clock derived from a single highly stable oscillator, such as a TCXO or OXCO 300 to the DPLLs 301a . . . 301n throughout the system as shown in FIG. 9. A major drawback of this approach is that long PCB traces from the single TCXO/OCXO 300 to each of DPLLs 301a . . . 301n pick up noise from adjacent traces and power noise, which would in turn seriously affect DPLL, jitter performance. Hence this kind of approach is typically only used only in applications where jitter is not an issue or when DPLLs are adjacent to each other so traces carrying TCXO/OCXO clock are very short. It should be noted that applications meeting these two conditions are very rare. Most applications in the telecom/datacom space use an approach similar to that shown in FIG. 8.

Figure 10:
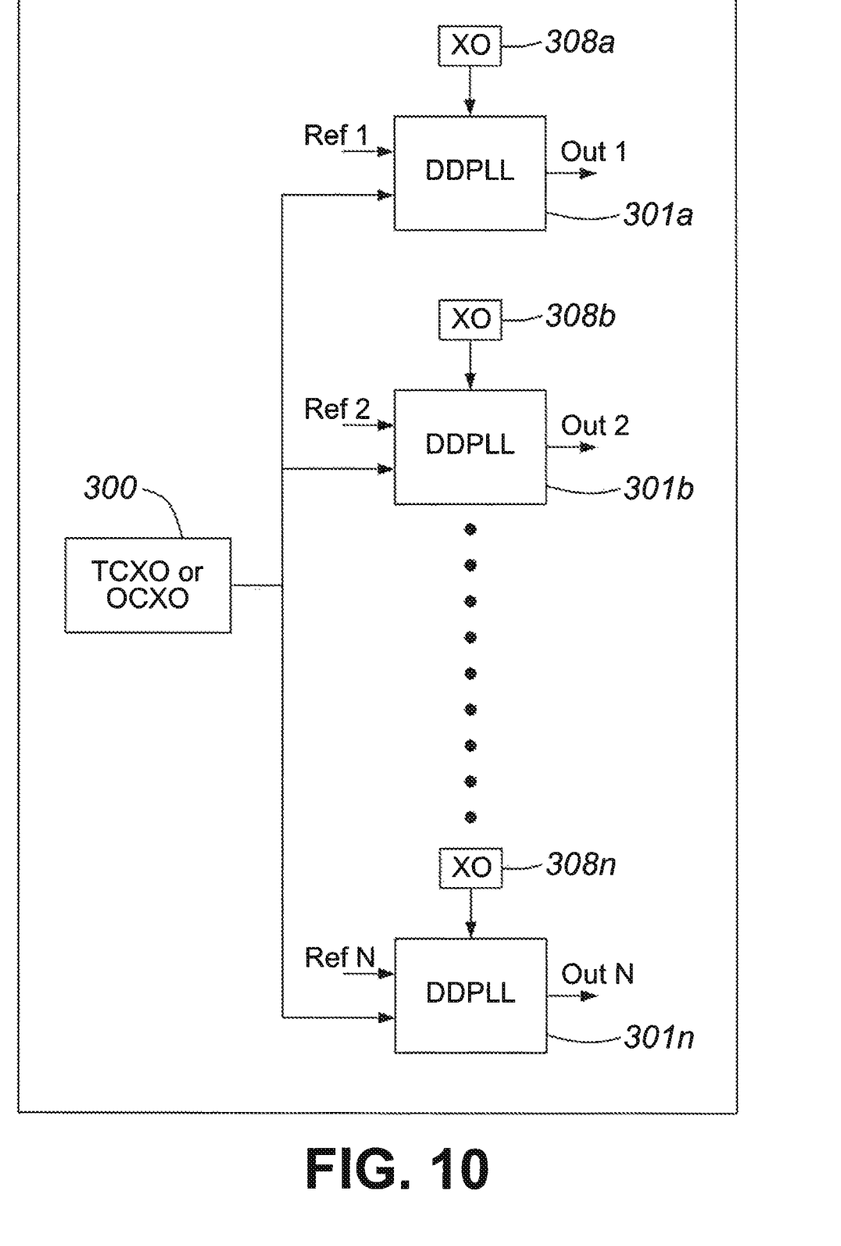
FIG. 10 shows an arrangement of DDPLLs with a common stable crystal oscillator in accordance with an embodiment of the invention.

In another embodiment of this invention, the designer can use a low-cost XO 308a . . . 308n as a local clock, equivalent to XO 108 of FIG. 2, and feed the single TCXO/OCXO 300 to one of the inputs of the double DPLLs 301a . . . 301b as shown in FIG. 10. On the other input of the respective double DPLLs 301a . . . 301b the designer may feed a recovered clock from the network, illustrated respectively as Ref1 . . . RefN, which needs to be cleaned by the respective double DPLL. Any jitter and wander from the TCXO/OXCO source 300 can be removed by the loop filter in the DDPLL loop, which uses the TXCO/OXCO source as its input.

Figure 11:
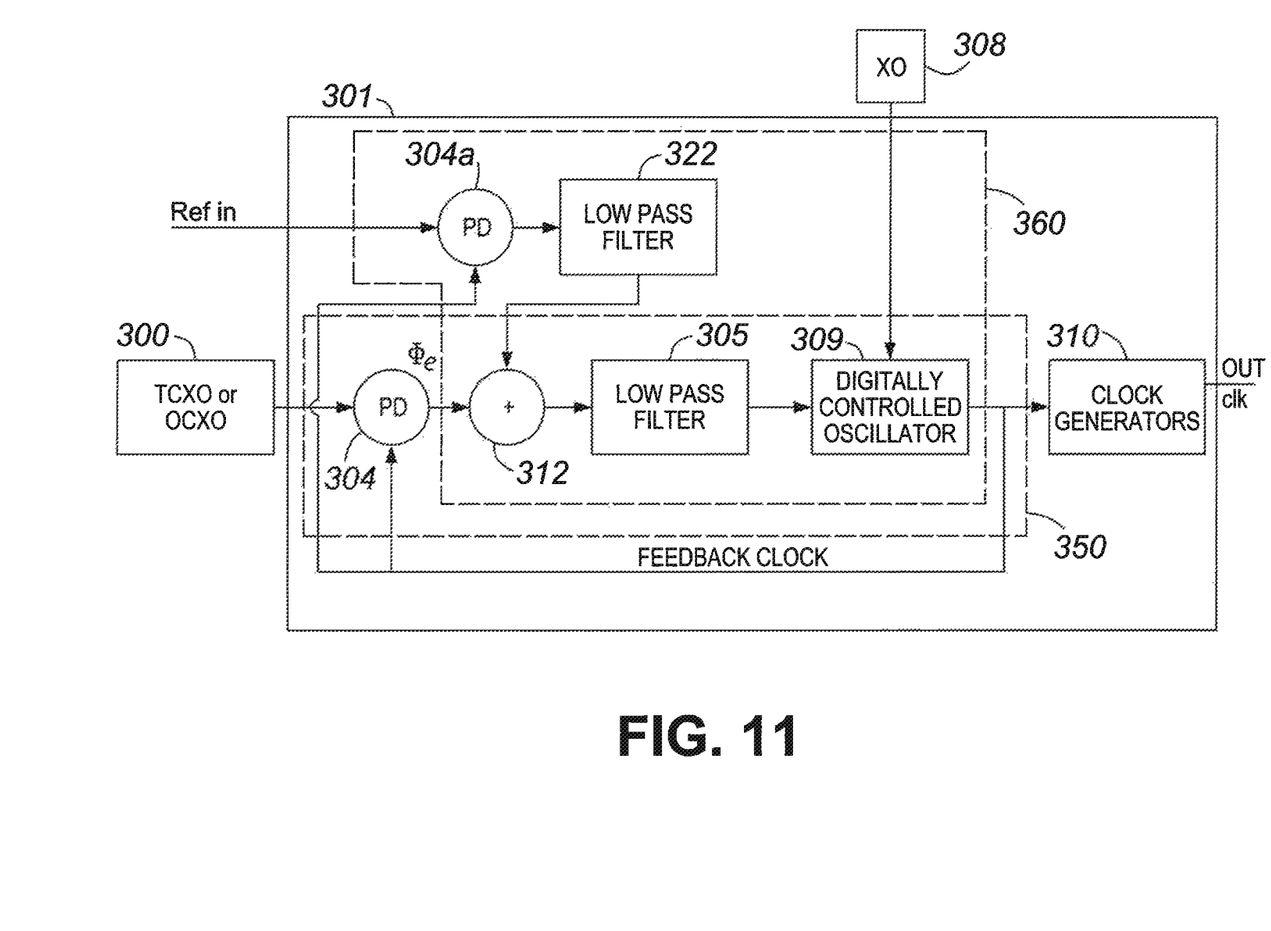
FIG. 11 shows a DDPPL employed in FIG. 10 in more detail.

FIG. 11 shows one of the double DPLLs 301. A clock from single TCXO/OCXO 300, distributed to all double DPLLs 301a . . . 301n, is used to provide frequency stability for each double DPLL. The double DPLLs will lock in frequency and phase to the respective reference input. Jitter/wander that may be picked up by long PCB traces carrying TCXO/OCXO clock is filtered by the DDPLL 301. The DDPLL 301 behaves as a low pass filter for jitter/wander present at its input. With respect to inputs from the TCXO/OCXO 300 the DDPLL 301 loop bandwidth, determined by low pass filter 305, would be set down to few Hz so that it filters noise picked up by long PCB traces, but not lower than that so that DDPLL 301 filters any wander coming from its master clock (XO) 300. With respect to the reference inputs the loop bandwidth of the DDPLLs 301 determined by loop filter 322 would be set to meet the applicable standard. For example, 0.1 Hz for the Telcordia GR-253 CORE standard.

If the reference input DDPLL 301 is locked to fails, the DDPLL 301 will go into holdover mode where its output frequency will be as stable as the single TCXO/OCXO 300. This is in contrast to a traditional DPLL where holdover stability is based on each DPLL's master clock 308a . . . 308n, which would either be a low cost oscillator XO, in which case stability would be an issue, or a high cost TXCO/OCXO provided for each DPLL 301, in which case cost resulting from the use of multiple TXCO/OXCOs would be an issue.

In FIG. 11, the circuit comprises a first DPLL 360 comprising PD304a, low pass filter 322, adder 312, low pass filter 305, and DCO 309, and a second DPLL 350 comprising PD 304, adder 312, low pass filter 305, and DCO 309. The two DPLLs are coupled together by a coupler in the form of adder 312. The XO 308 is a low cost crystal oscillator not requiring a high degree of stability.

In this embodiment the fractional difference between frequencies can be in the order of $10^{-4}$. In this case the overflow adjustment will be done every ⅔ seconds. This can be done in the same way as the embodiment described with reference to FIG. 2.

Figure 12:
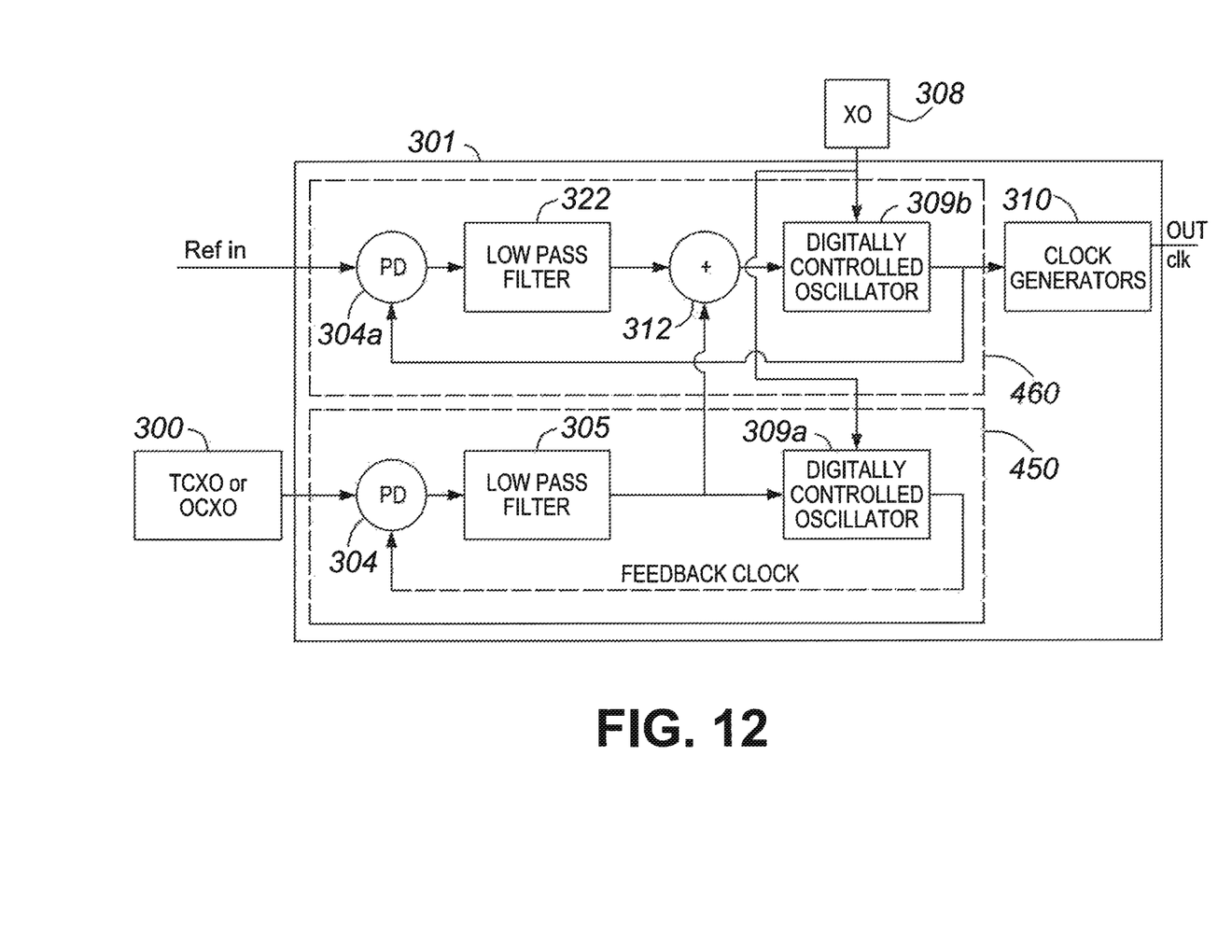
FIG. 12 is an alternative embodiment of the arrangement shown in FIG. 11.

As in the case of the embodiment of FIG. 7, there is an alternative arrangement employing two DCOs 309a, 309b as shown in FIG. 12. In this case the first PLL 460 comprises the PD 304a, low pass filter 322, adder 330 and DCO 309b, and the second PLL 450 comprises the PD304, low pass filter 305, and DCO 309a. Like the embodiment of FIG. 7 no overflow control is required. The disadvantage however is that two DCO's are required, which increases the cost.

It should be appreciated by those skilled in the art that any block diagrams herein represent conceptual views of illustrative circuitry embodying the principles of the invention. For example, a processor may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non volatile storage. Other hardware, conventional and/or custom, may also be included. The functional blocks or modules illustrated herein may in practice be implemented in hardware or software. Specifically, it will be understood that the term "circuit" includes a software implementation.

The invention claimed is:

1. A double phase-locked loop, comprising:
a first narrowband phase-locked loop including a first loop filter configured to reduce phase noise in a first input clock;
a second phase-locked loop including a second loop filter configured to receive a second input clock from a stable clock source, said second input clock having a frequency with a fractional offset relative a frequency of said first input clock of not more than 200 ppm;
said first phase-locked loop having a bandwidth at least an order of magnitude less than said second phase-locked loop;
a controlled oscillator driven by a local oscillator responsive to a control input to generate an output with a frequency and phase,
said second loop filter providing said control input so that at start-up said controlled oscillator locks to said second input clock; and
a coupler coupling an output of said first loop filter to said second phase-locked loop,
said first-phase locked loop being operable when said second phase locked loop is locked to said second input clock to modify said control input with the output of said first loop filter so that said controlled oscillator gradually becomes locked to said first input clock in both frequency and phase.

2. A double phase-locked loop as claimed in claim 1, wherein said first phase locked loop is embedded in said second phase-locked loop, said first and second phase locked loops sharing said controlled oscillator.

3. A double phase-locked loop as claimed in claim 2, wherein said comprises an adder in said second phase-locked loop configured to add an output of said first loop filter to an output of a phase detector forming part of said second phase locked loop upstream of said second loop filter.

4. A double phase-locked loop as claimed in claim 1, wherein said second phase-locked loops comprises a controlled oscillator driven by a said local oscillator, said first phase-locked loop has an adder downstream of said first loop filter configured to add an output of said second loop filter to an output of said first loop filter to provide said control input to the controlled oscillator of said first phase locked loop, an output of said controlled oscillator of said first phase locked loop providing said common output.

5. A double phase-locked loop as claimed in claim 1, wherein said first input clock comprises a clock signal recovered from a telecom/datacom network, and said stable clock source is selected from the group consisting of a temperature controlled crystal oscillator (TCXO) and an oven controlled crystal oscillator (OCXO).

6. A double phase-locked loop as claimed in claim 5, which is one of multiple double phase-locked loops supplied by said stable clock source.

7. A double phase-locked loop as claimed in claim 1, wherein said first input clock comprises a clock signal recovered over a packet network from a standard time source, and said second input clock comprises a clock signal derived from a synchronous network.

8. A double phase-locked loop as claimed in claim 7, wherein the synchronous network is synchronous Ethernet.

9. A method of reducing phase noise in a first input clock in a double phase-locked loop, comprising:
filtering the first input clock in a first phase-locked loop including a first narrowband loop filter;
receiving a second input clock from a stable clock source in a second phase-locked loop, said second input clock having a frequency with a fractional offset relative a frequency of said first input clock of not more than 200 ppm, said first phase-locked loop having a bandwidth that is at least an order of magnitude less than said second phase-locked loop;
applying a control signal from second loop filter to a controlled oscillator driven by a local oscillator to generate an output with a frequency and phase that locks at start-up to said second input clock; and
coupling an output of said first phase-locked loop filter to said second phase locked loop when said second phase locked loop is locked to said second input clock to modify said control signal so that said controlled oscillator gradually becomes locked to said first input clock in frequency and phase.

10. A method as claimed in claim 9, wherein said first phase-locked loop is embedded in said second phase-locked loop, said first and second phase-locked loops sharing said controlled oscillator.

11. A method as claimed in claim 10 wherein an output of said first loop filter is added to an output of a phase detector forming part of said second phase-locked loop upstream of said second loop filter.

12. A method as claimed in claim 9, wherein an output of said second loop filter is added to an output of said first loop filter to provide said control signal to the controlled oscillator of said first phase-locked loop, an output of said controlled oscillator of said first phase-locked loop providing said common output.

13. A method as claimed in claim 9, wherein said first input clock comprises a clock signal recovered from a packet network, and said stable clock source is selected from the group consisting of a temperature controlled crystal oscillator (TCXO) and an oven controlled crystal oscillator (OCXO).

14. A method as claimed in claim 9, wherein said double phase-locked loop is one of multiple double phase-locked loops supplied by said stable clock source.

15. A method as claimed in claimed in claim 9, wherein said first input clock comprises a clock signal recovered over a packet network from a standard time source, and said second input clock comprises a clock signal derived from a synchronous network.

16. A method as claimed in claim 15, wherein the synchronous network is synchronous Ethernet.

17. A method of generating a local clock in a synchronous packet communications network, wherein the local clock is locked to a stable reference clock and to a master clock in a double phase-locked loop including a first low pass filter, comprising:
   extracting a clock signal derived from said reference clock from an incoming data stream over the synchronous packet communications network;
   determining a first phase error of a controlled oscillator relative to said clock signal;
   generating a second phase error that is subject to wander of the controlled oscillator relative to said master clock;
   filtering said second phase error with a second low pass filter having a cut-off frequency less than said first low pass filter;
   adding said filtered second phase error to said first phase error; and
   adjusting the frequency of the controlled oscillator in the double phase-locked loop based on the sum of said first and second phase errors,
   wherein the cut-off frequency of said first low pass filter lies in the range 0.1 to 1.0 Hz and of said second low pass frequency lies in the range 0.001 Hz to 0.1 Hz, and the ratio of bandwidths of said first and second low pass filters is at least 1:10.

18. A method as claimed in claim 17, further comprising receiving asynchronous timing packets from said master clock over said synchronous packet communications network to generate said second phase error.

19. A method as claimed in claim 17, wherein when said first phase error reaches a threshold value, said threshold value is subtracted from said first phase error and added to said second phase error to prevent an overflow condition.

20. A method as claimed in claim 17, wherein said synchronous packet communications network is a synchronous Ethernet network.

21. A method as claimed in claim 17, wherein the master clock is synchronized to Universal Coordinated Time.

22. A local clock generator for generating a local clock in a synchronous packet communications network, wherein the local clock is locked to a stable reference clock and to a master clock subject to wander in a phase-locked loop including a first low pass filter, comprising:
   a controlled oscillator;
   a first module configured to extract a clock signal derived from said primary reference clock from an incoming data stream over the synchronous packet communications network;
   a phase detector configured to generate a first phase error of the controlled oscillator relative to said extracted clock signal;
   a second module configured to generate a second phase error that is subject to wander of the controlled oscillator relative to the master clock;
   a second low pass filter for filtering said second phase error, said second low pass filter having a lower cut-off frequency than said first low-pass filter; and
   an adder configured to add said first and second phase errors;
   wherein the controlled oscillator is configured to generate an output dependent on the sum of said first and second phase errors; and
   wherein the cut-off frequency of said first low pass filter lies in the range 0.1 to 1.0 Hz and the cut-off frequency of said second low pass frequency lies in the range 0.001 Hz to 0.1 Hz, and the ratio of bandwidths of the first and second low pass filters is at least 10:1.

23. A local clock generator based as claimed in claim 22, wherein said second module is configured to generate said second phase error from asynchronous timing packets received from said master clock over said synchronous packet communications network.

24. A local clock generator as claimed in claim 22, further comprising a module configured, upon the first phase error reaching a predetermined threshold, to subtract said threshold from said first phase error and add said threshold to said second phase error to prevent an overflow condition.

25. A local clock generator as claimed in claim 22, wherein said first module is an Ethernet physical layer device and, wherein said second module includes an IEEE 1558 processor.

* * * * *